(12) United States Patent
Koo et al.

(10) Patent No.: US 8,902,646 B2
(45) Date of Patent: Dec. 2, 2014

(54) MEMORY AND METHOD FOR OPERATING THE SAME

(75) Inventors: Cheul-Hee Koo, Gyeonggi-do (KR); Byung-Ryul Kim, Gyeonggi-do (KR); Byoung-Young Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 151 days.

(21) Appl. No.: 13/607,900

(22) Filed: Sep. 10, 2012

(65) Prior Publication Data

US 2013/0128661 A1 May 23, 2013

(30) Foreign Application Priority Data

Nov. 22, 2011 (KR) .......................... 10-2011-0122334

(51) Int. Cl.
- *G11C 16/24* (2006.01)
- *G11C 16/26* (2006.01)
- *G11C 16/34* (2006.01)
- *G11C 16/04* (2006.01)

(52) U.S. Cl.
CPC ............. *G11C 16/0483* (2013.01); *G11C 16/26* (2013.01); *G11C 16/3418* (2013.01); *G11C 16/24* (2013.01)

USPC ............ 365/185.02; 365/185.21; 365/185.25; 365/189.05; 365/203

(58) Field of Classification Search
CPC .... G11C 16/24; G11C 16/26; G11C 16/0483; G11C 16/3418; G11C 16/06; G11C 16/10; G11C 11/5642
USPC ............. 365/185.02, 185.18, 185.21, 185.25, 365/189.05, 203
See application file for complete search history.

(56) References Cited

U.S. PATENT DOCUMENTS

| | | | |
|---|---|---|---|
| 5,886,937 A | * | 3/1999 | Jang ............................... 365/203 |
| 2010/0135075 A1 | * | 6/2010 | Moschiano et al. ..... 365/185.02 |
| 2010/0232221 A1 | * | 9/2010 | Park et al. ................ 365/185.03 |

* cited by examiner

*Primary Examiner* — Tan T. Nguyen
(74) *Attorney, Agent, or Firm* — IP & T Group LLP

(57) ABSTRACT

A memory includes a first memory cell, a bit line corresponding to the first memory cell, at least one second memory cell adjacent to the first memory cell, and a page buffer configured to read data of the first memory cell by precharging the bit line to a voltage level which is decided in response to data of the at least one second memory cell.

19 Claims, 7 Drawing Sheets

MEMORY AND METHOD FOR OPERATING THE SAME

CROSS-REFERENCE TO RELATED APPLICATIONS

The present application claims priority of Korean Patent Application No. 10-2011-0122334, filed on Nov. 22, 2011, which is incorporated herein by reference in its entirety.

BACKGROUND

1. Field

Exemplary embodiments of the present invention relate to a memory and a method for operating the same.

2. Description of the Related Art

In general, a memory is roughly divided into a volatile memory which may loss input information when power supply is cut off and a nonvolatile memory which may continuously maintain a storage state of input information even though power supply is cut off. The volatile memory may include DRAM and SRAM, and the nonvolatile memory may include a flash memory such as EEPROM. Hereinafter, the nonvolatile memory and the features thereof will be described.

The nonvolatile memory (or particularly a flash memory) programs a memory cell by storing electrons in a conductive band of a floating gate using F-N (Fouler-Nordheim) tunneling in the conductive band. Here, the threshold voltage of the memory cell is increased by electric charge stored in the conductive band of the floating gate. Depending on the value of data to be stored in the memory cell, the level and number of program pulses applied to the floating gate may differ. Therefore, depending on the value of data stored in the memory cell, the amount of electric charge stored in the conductive band of the floating gate differs. That is, the voltage distribution of the threshold voltage of the memory cell differs depending on the value of the data stored therein. For reference, since the characteristics of memory cells inside a nonvolatile memory device are different from each other, even memory cells applied with the same level and number of program pulses have a certain range of threshold voltage distribution, instead of the same threshold voltage.

The nonvolatile memory includes a memory cell array. The memory cell array includes a plurality of memory blocks, and each of the memory blocks includes a plurality of pages. Each of the pages includes a plurality of memory cells. The nonvolatile memory performs an erase operation on the basis of memory blocks and performs a write or read operation on the basis of pages.

In the nonvolatile memory, the threshold voltage of a memory cell differs depending on the value of data stored in the memory cell as described above. Therefore, such a characteristic may be used to read the value of the data stored in the memory cell. For example, a single level cell (hereinafter, referred to as SLC) capable of storing one-bit data has an erase state in which erase data is stored or a program state in which program data is stored. The threshold voltage distribution of memory cells in the erase state has a lower average than the threshold voltage distribution of memory cells in the program state. Therefore, a voltage having a level between both voltage distributions may be used to determine whether the data stored in a memory cell is erase data or program data.

Here, the threshold voltage distribution of memory cells in which data having the same value are stored is to be constant at all times, in order to output the data stored in the memory cells with precision. However, with the increase in integration degree of memory cells, the distance between the memory cells has been reduced to such a level that the threshold voltage of a memory cell is influenced by the value of data stored in an adjacent memory cell. Such a phenomenon is referred to as cell interference. The reason why the cell interference occurs is that the threshold voltage of a memory cell may be influenced by a program pulse applied to an adjacent memory cell, because of parasitic capacitance existing between the memory cells.

FIG. 1 is a diagram showing change in threshold voltage distributions, caused by cell interference. In a first distribution, a solid line 101 indicates the threshold voltage distribution of memory cells which are not influenced by cell interference, among memory cells storing erase data, and a dotted line 102 indicates the threshold voltage distribution of memory cells which are influenced by the cell interference, among the memory cells storing erase data. In a second distribution, a solid line 103 indicates the threshold voltage distribution of memory cells which are not influenced by cell interference, among memory cells storing program data, and a dotted line 104 indicates the threshold voltage distribution of memory cells which are influenced by the cell interference, among the memory cells storing program data.

Referring to FIG. 1, when program data is stored in a memory cell, a threshold voltage of an adjacent cell may be influenced and increased by program pulses applied to the memory cell. Therefore, the threshold voltage distribution of influenced memory cells becomes higher than the original distribution (102, 104). Here, the threshold voltage distribution increases in accordance with the increase in the level and number of the program pulses.

The cell interference may cause an error of a read operation. Therefore, research has been conducted on technology relating to various interference compensation read operations in order to reduce an error of a read operation, caused by cell interference.

SUMMARY

An embodiment of the present invention is directed to a memory which compensates for cell interference by controlling the level of a voltage to which a bit line is precharged when reading data of a memory cell, thereby reducing an error of a read operation, and a method for operating the same.

In accordance with an exemplary embodiment of the present invention, a memory includes: a first memory cell; a bit line corresponding to the first memory cell; at least one second memory cell adjacent to the first memory cell; and a page buffer configured to read data of the first memory cell by precharging the bit line to voltage level which is decided in response to data of the at least one second memory cell.

In accordance with another exemplary embodiment of the present invention, a method for operating a memory includes: reading data of at least one second memory cell adjacent to a first memory cell; precharging a bit line corresponding to the first memory cell to a voltage level which is decided in response to data of the at least one second memory cell; and reading data of the first memory cell using voltage change of the precharged bit line.

In accordance with yet another embodiment of the present invention, a memory includes: a first even memory cell; a first odd memory cell; an even bit line corresponding to the first even memory cell; an odd bit line corresponding to the first odd memory cell; at least one second memory cell adjacent to the first even memory cell; at least one third memory cell adjacent to the first odd memory cell; and a page buffer configured to precharge the bit line to a voltage level which is decided in response to data of the at least one second memory cell when reading data of the first even memory cell, and precharge the bit line to a voltage level which is decided in response to data of the at least one third memory cell when reading data of the first odd memory cell.

DETAILED DESCRIPTION

Figure 1:
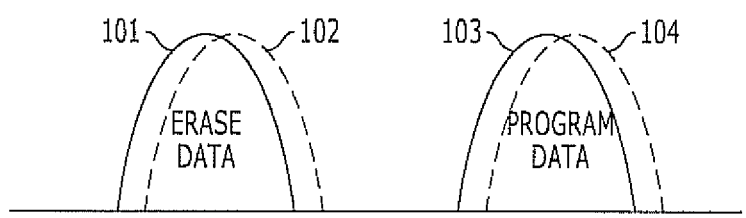
FIG. 1 is a diagram showing change in threshold voltage distributions, caused by cell interference.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following descriptions, an activation level and a deactivation level of each signal may be set differently, e.g., a 'low' or 'high' level, depending on different designs.

Figure 2:
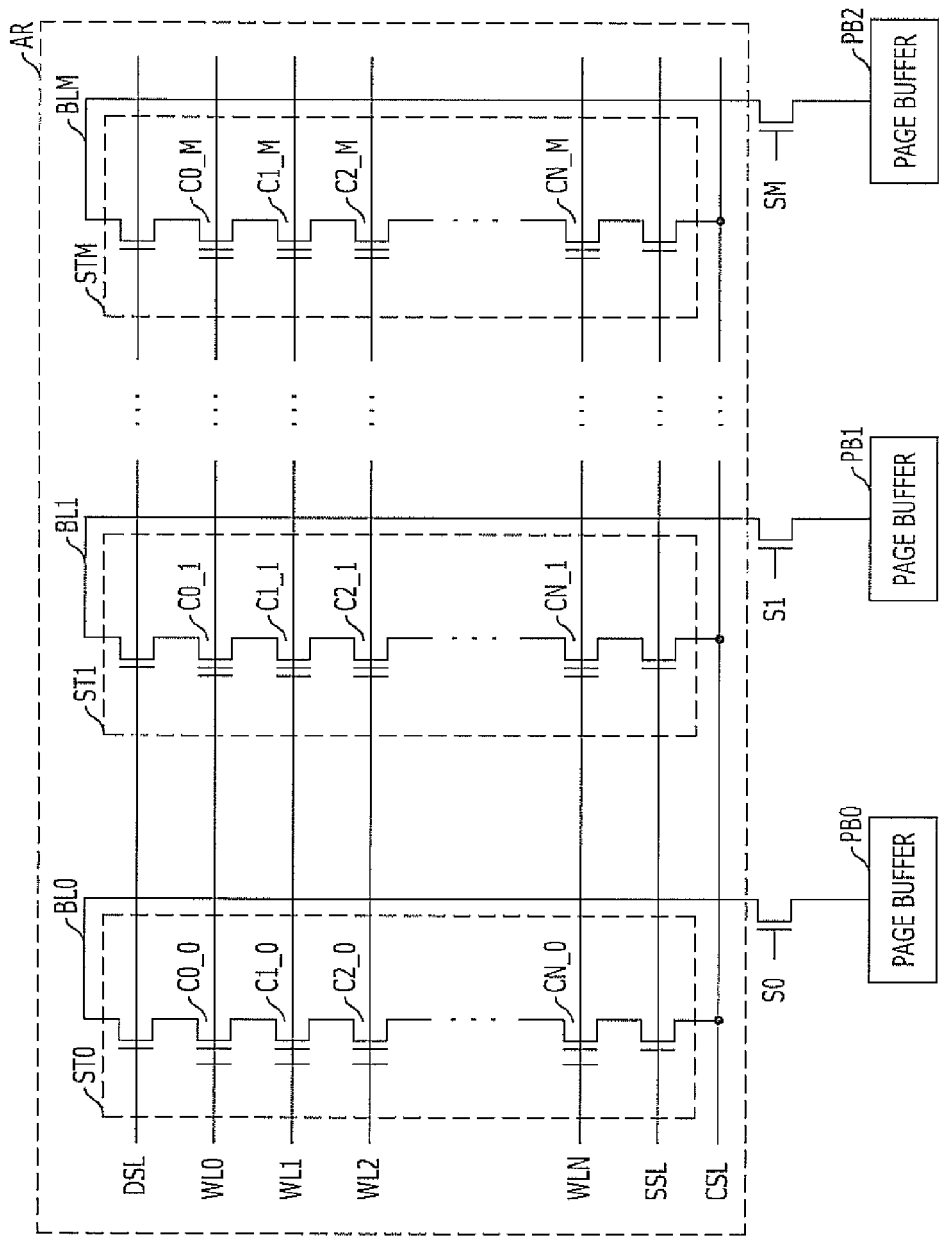
FIG. 2 is a configuration diagram of a memory in accordance with an exemplary embodiment of the present invention.

FIG. 2 is a configuration diagram of a memory in accordance with an embodiment of the present invention. The memory illustrated in FIG. 2 decides a precharge level of a bit line corresponding to a memory cell to be read by considering data of one adjacent memory cell during a read operation.

A cell array AR of the memory illustrated in FIG. 2 includes a plurality of cell strings ST0 to STM. In FIG. 2, it is described as an example that the cell array AR includes (M+1) cell strings ST0 to STM. A cell string refers to a string structure in which a plurality of memory cells corresponding to each bit line are coupled in series between a source selection transistor receiving SSL and a drain selection transistor receiving DSL. Floating gates of the respective memory cells receive various voltages through a plurality of word lines WL0 to WLN. Each of the cell strings is selectively coupled to a bit line through a drain selection transistor and selectively coupled to a common source line CSL coupled to a default voltage terminal through a source selection transistor. Here, 'X' in 'CX_Y' represents which word line a memory cell corresponds (is coupled) to, and 'Y' in 'CX_Y' represents where string a memory cell is included. For example, 'C2_5' represents a memory cell corresponding to a second word line WL2 and a fifth cell string ST5 (start from zero-th).

Referring to FIG. 2, the memory includes a first memory cell, a bit line corresponding to the first memory cell, one or more second memory cells adjacent to the first memory cell, and a page buffer corresponding to the bit line, and the page buffer is configured to precharge the bit line to a level which is decided depending on data of the one or more second memory cell, when reading data of the first memory cell.

Here, the first memory cell indicates a memory cell from which data is to be read, and the one or more second memory cells indicate memory cells adjacent to the first memory cell. Hereinafter, a memory cell adjacent to a specific memory cell refers to a memory cell which is arranged within a given distance from the specific memory cell and considered to decide a precharge level of a bit line corresponding to the specific memory cell, when data of the specific memory cell is read. The setting of the adjacent memory cell may differ depending on different designs. One second memory cell may be set as an adjacent memory cell of two or more first memory cells. Referring to FIG. 2, a case in which the one or more second memory cells include a first adjacent memory cell, that is, a case in which one memory cell is adjacent to the first memory cell will be described.

Hereinafter, the operation of the memory of FIG. 2 will be described, and it may be described by dividing the operation of the memory depending on the relationship between the first adjacent memory cell and the first memory cell.

(1) The operation of the memory when the first adjacent memory cell and the first memory cell correspond to the same bit line (when the first adjacent memory cell and the first memory cell are included in the same cell string)

When the first adjacent memory cell corresponds to the same bit line as the first memory cell and the first memory cell is a memory cell coupled to a K-th word line WLK (K is a natural number equal to or less than N), the first adjacent memory cell may include a memory cell coupled to one word line of zero-th to (K−1)-th word lines WL0 to WLK−1 or a memory cell coupled to one word line of (K+1)-th to N-th word lines WLK+1 to WLK. Since cell interference increases with a reduction in distance between memory cells, the first adjacent memory cell may include a memory cell coupled to the (K−1)-th word line WLK−1 or a memory cell coupled to the (K+1)-th word line WLK+1.

In FIG. 2, when the first memory cell is a memory cell coupled to the K-th word line WLK, memory cells coupled to the zero-th to (K−1)-th word lines WL0 to WLK−1 are arranged above the first memory cell, and memory cells coupled to the (K+1)-th to N-th word lines WLK+1 to WLK are arranged below the first memory cell.

Hereinafter, a case in which 'C1_1' is set to the first memory cell and 'C0_1' is set to the first adjacent memory cell, that is, a case in which the first adjacent memory cell C0_1 is arranged above the first memory cell C1_1 will be described. The first memory cell C1_1 and the first adjacent memory cell C0_1 correspond to the same bit line BL1 and are included in the same cell string ST1.

When a read operation for the first memory cell C1_1 starts, data of the first adjacent memory cell C0_1 is first read and stored in a page buffer PB1. The page buffer PB1 precharges the bit line BL1 to a level which is decided by the data of the first adjacent memory cell C0_1. When the bit line BL1 is precharged, a sensing transistor receiving 'S1' is in an on state.

When the data of the first adjacent memory cell C0_1 stored in the page buffer PB1 is first data, the page buffer PB1 precharges the bit line BL1 to a first level. Here, the first level may be equal to a level to which the bit line BL1 is precharged during a read operation in the conventional memory. When the data of the first adjacent memory cell C0_1 stored in the page buffer PB1 is second data, the page buffer PB1 precharge the bit line BL1 to a second level lower than the first level. At this time, the first data may include erase data, and the second data may include program data. That is, when the data of the first adjacent memory cell C0_1 is program data, the page buffer PB1 of the memory in accordance with the embodiment of the present invention precharges the bit line BL1 to a lower level than when the data of the first adjacent memory cell C0_1 is erase data.

Then, a read voltage having a level between the threshold voltage level of a memory cell in the erase state and the threshold voltage level of a memory cell in the program state is applied to the word line WL1 coupled to the first memory cell C1_1 during a given period. After the read voltage is applied to the word line WL1, the voltage level of the bit line BL1 is decided depending on the data stored in the first memory cell C1_1. The page buffer PB1 senses the voltage of the bit line BL1 after the read voltage is applied and reads the data of the first memory cell C1_1 depending on the sensed voltage level of the bit line BL1. The configuration and operation of the page buffer PB1 will be described in detail with reference to FIG. 3.

No matter which word line the first adjacent memory cell is coupled to, among the zero-th to (K−1)-th word lines WL0 to WLK−1 and the (K+1)-th to N-th word lines WLK+1 to WLN, the operation of the memory is performed in the same manner as described above. In the above-described configuration, the data of the first memory cell C1_1 and data of first memory cells C1_0 and C1_2 to C1_M included in the same page as the first memory cell C1_1 are read together. At this time, first adjacent memory cells corresponding to the first memory cells C1_0 and C1_2 to C1_M are represented by C0_0 and C0_2 to C0_M, respectively, and the operations of page buffers PB0 and PB2 to PBM corresponding to the first memory cells C1_0 and C1_2 to C1_M, respectively, are performed in the same manner as the above-described page buffer PB1.

(2) The operation of the memory when the first adjacent memory cell and the first memory cell corresponds to the same word line (when the first adjacent memory cell and the first memory cell are coupled to the same word line)

When the first adjacent memory cell corresponds to the same word line as the first memory cell and the first memory cell is a memory cell included in a K-th cell string STK, the first adjacent memory cell may include a memory cell included in one cell string of zero-th to (K−1)-th cell strings ST0 to STK−1 or a memory cell included in one cell string of (K−1)-th to M-th cell strings STK+1 to STM. Since cell interference increases with a reduction in distance between memory cells, the first adjacent memory cell may include a memory cell coupled to the (K−1)-th cell string STK−1 or a memory cell included in the (K+1)-th cell string STK+1.

In FIG. 2, when the first memory cell is a memory cell included in the K-th cell string STK, memory cells included in the zero-th to (K−1)-th cell strings ST0 to STK−1 may include memory cells arranged in the left side of the first memory cell, and memory cells included in the (K+1) to M-th cell strings STK+1 to STM may include memory cells arranged in the right side of the first memory cell.

In this embodiment of the present invention, when program data is stored in an adjacent memory cell, cell interference occurring in a memory cell may be compensated by lowering a precharge level more than when erase data is stored in the adjacent memory cell, and the reason is as follows.

In general, a read operation in a flash memory goes through the following process. First, a bit line corresponding to a memory cell to be read is precharged. Then, a proper read voltage is applied to a word line corresponding to the memory cell to be read. At this time, all memory cells included in the same cell string as the memory cell to be read are turned on. When erase data is stored in the memory cell to be read, a relatively large amount of current passes through the cell string in response to a read voltage, because the threshold voltage of the memory cell is low. When program data is stored in the memory cell to be read, a relatively small amount of current passes through the cell string in response to the read voltage, because the threshold voltage of the memory cell is high. Therefore, the voltage of a bit line corresponding to the memory cell storing the erase data quickly decreases, and the voltage of a bit line corresponding to the memory cell storing the program data slowly decreases.

When the read voltage is applied during a given period, the voltage of the bit line corresponding to the memory cell storing the erase data becomes lower than the voltage of the bit line corresponding to the memory cell storing the program data. Then, the voltage of the bit line is sensed. When the voltage of the bit line is lower than a reference voltage of a proper level, the erase data is read, and when the voltage of the bit line is higher than the reference voltage, the program data is read.

However, when program data is stored in the adjacent memory cell, the threshold voltage of the memory cell is increased by the cell interference. Therefore, when the read voltage is applied to a word line, a smaller amount of current passes though the cell string than when the threshold voltage of the memory cell is not influenced by the cell interference. Even though the erase data is stored in the memory cell, the voltage of the bit line may not be lowered to a proper level. Accordingly, when the program data is stored in the adjacent memory cell, the precharge level of the bit line may be slightly lowered to apply the read voltage, in consideration of the threshold voltage increased by the cell interference. In this case, although a smaller amount of current passes than when the cell interference does not occur, the voltage of the bit line may be lowered to a proper level.

Here, how much the precharge level of the bit line is to be compensated in consideration of the cell interference may be decided by a test. When the program data is stored in the adjacent memory cell, a read operation may be performed while controlling the precharge level of the bit line. In this case, a precharge level at which the smallest number of errors occur during the read operation may be decided as a second level.

The memory in accordance with the embodiment of the present invention may be applied to a case in which a plurality of memory cells included in the cell array are multi-level cells (MLC) as well as single level cells (SLC). When the plurality of memory cells are MLCs, a bit line corresponding to a memory cell to be read may be precharged to a level which is decided depending on whether the least significant bit (LSB) data of an adjacent memory cell is erase data or program data. Furthermore, how much the precharge level is to be controlled may be set differently depending on the value of the data stored in the adjacent memory cell. For example, as the threshold voltage of the adjacent memory cell increases, the precharge level may be lowered.

The memory in accordance with the embodiment of the present invention may compensate the cell interference by precharging the bit line corresponding to the memory cell to be read to a level which is decided depending on the data of the adjacent memory cell, thereby performing a precise read operation.

Figure 3:
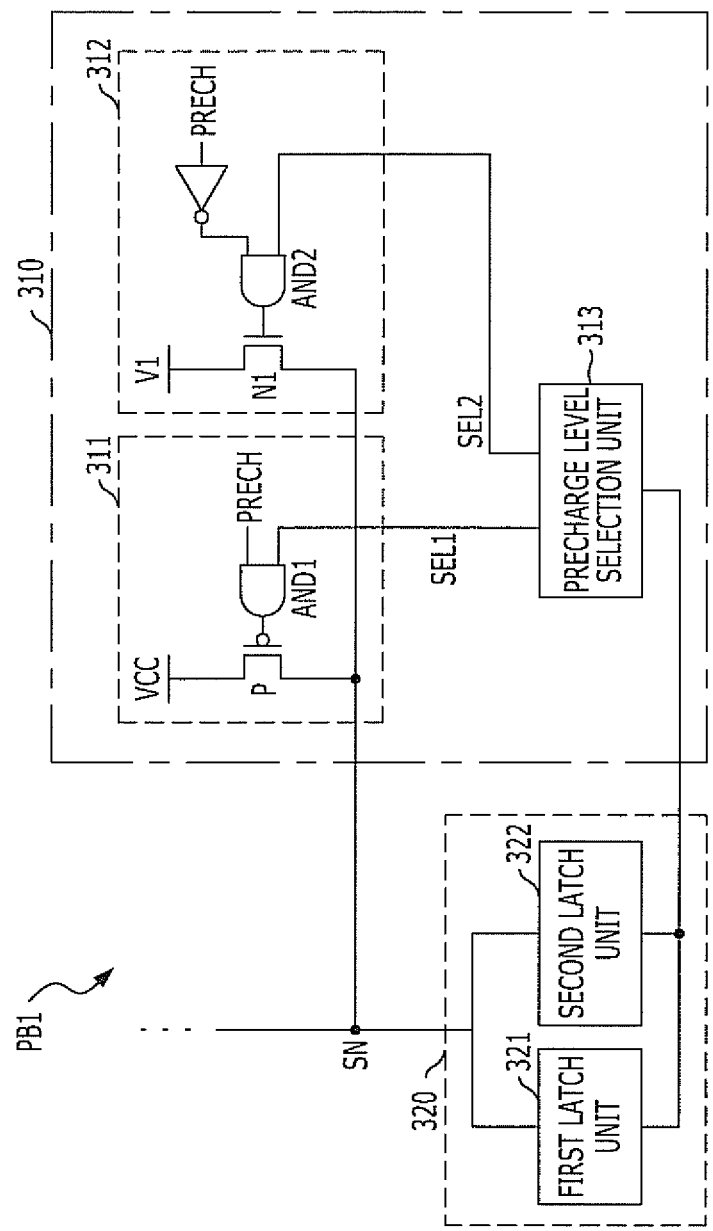
FIG. 3 is a configuration diagram of a page buffer PB1 shown in FIG. 2.

FIG. 3 is a configuration diagram of the page buffer PB1 of FIG. 2. In the following descriptions, a case in which 'C1_1' represents the first memory cell and 'C0_1' represents the first adjacent memory cell will be shown as an example.

Referring to FIG. 3, the page buffer PB1 includes a precharge unit 310 and a latch unit 320. The precharge unit 310 is configured to precharge a bit line BL1 to a first or second level depending on data of the first adjacent memory cell C0_1. The latch unit 320 is configured to store data of the first memory cell C1_1 and the data of the first adjacent memory cell C0_1 and transmit the data of the first adjacent memory cell C0_1 to the precharge unit 310.

Hereinafter, the configuration and operation of the page buffer PB1 will be described. The configurations and operations of the other page buffers PB0 and PB2 to PBM of FIG. 2 are the same as the configuration and operation of the page buffer PB1 of FIG. 3.

The precharge unit 310 includes a first precharge unit 311, a second precharge unit 312, and a precharge level selection unit 313. The first precharge unit 311 is configured to precharge the bit line BL1 to the first level. The second precharge unit 312 is configured to precharge the bit line BL1 to the second level. The precharge level selection unit 313 is configured to enable the first precharge unit 311 when the data of the first adjacent memory cell C0_1 is first data and enable the second precharge unit 312 when the data of the first adjacent memory cell C0_1 is second data.

Furthermore, the latch unit 320 includes a first latch unit 321 and a second latch unit 322. The first latch unit 321 is configured to store the data of the first adjacent memory cell C0_1, which is read first, and store the data of the first memory cell C1_1, which is read next. The second latch unit 322 is configured to receive the data of the first adjacent memory cell C1_1 from the first latch unit 321, store the received data, and transmit the stored data to the precharge level selection unit 313. The first latch unit 321 may serve as a main latch configured to receive data to be programmed into a memory cell and transmit the received data to the bit line BL1 through a sensing node SN or configured to read data stored in a memory cell and store the read data. The second latch unit 322 may serve as a cache latch configured to receive data to be programmed or output read data through an I/O control logic (not illustrated). Furthermore, although not illustrated in FIG. 3, the page buffer PB1 may further include a temporary latch unit for temporarily storing data when a program operation or read operation is performed and a flag latch unit for storing flag information indicating the state of a memory cell or page buffer. For example, the flag information may include information indicating whether or not an error occurred in a page buffer group including a plurality of page buffers.

Referring to FIG. 3, the operation of the page buffer PB1 will be described in more detail.

During a read operation, the data of the first adjacent memory cell C0_1 is first read and stored in the first latch unit 321. The data of the first adjacent memory cell C0_1, stored in the first latch unit 321, is transmitted to the second latch unit 322. The second latch unit 322 receives and stores the data of the first adjacent memory cell C0_1, and transmits the stored data to the precharge level selection unit 313.

During a period for precharging the bit line BL1 (hereinafter, referred to as 'precharge period'), the precharge level selection unit 313 activates a first selection signal SEL1 to a low level, when the data of the first adjacent memory cell is the first data (erase data), and activates a second selection signal SEL2 to a high level, when the data of the first adjacent memory cell is the second data (program data).

When the first selection signal SEL1 is activated in the precharge period, an output of an AND gate AND1 becomes low in an activation period of a precharge signal PRECH which is activated to a low level in the precharge period. Therefore, a PMOS transistor P is turned on to transmit a first-level voltage VCC to the bit line BL1 through the sensing node SN. Therefore, the bit line BL1 is precharged to the first level. At this time, since the second selection signal SEL2 is deactivated to a low level and an output of an AND gate AND2 is low, an NMOS transistor N is turned off.

When the second selection signal SEL2 is activated in the precharge period, the output of the AND gate AND2 becomes high in the activation period of the precharge signal PRECH. Therefore, the NMOS transistor N is turned on to transmit a second-level voltage V1 to the bit line BL1 through the sensing node SN. Therefore, the bit line BL1 is precharged to the second level. At this time, since the first selection signal SEL1 is deactivated to a high level and the output of the AND gate AND1 is high, the PMOS transistor P is turned off.

When a read voltage is applied to the first memory cell C1_1 after the bit line BL1 is precharged to the first or second level, the voltage of the bit line BL1 is lowered to a different level depending on the data stored in the first memory cell C1_1. The page buffer PB1 senses the voltage of the bit line BL1 through the sensing node SN and stores the read data of the first memory cell C1_1 in the first latch unit 321 using the sensed voltage.

Figure 4:
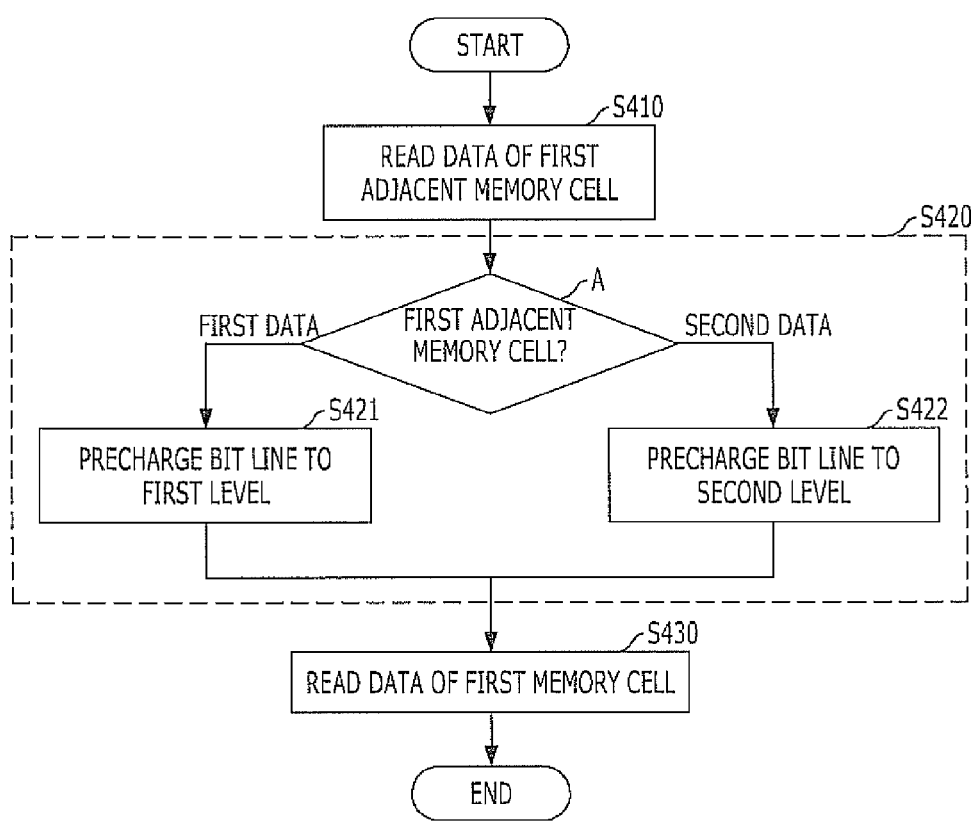
FIG. 4 is a flow chart explaining a method for operating the memory in accordance with the exemplary embodiment of the present invention.

FIG. 4 is a flow chart illustrating a method for operating the memory in accordance with the embodiment of the present invention. In the memory operation method of FIG. 4, a precharge level of a bit line corresponding to a memory cell to be read is decided by considering data of one adjacent memory cell during a read operation.

Referring to FIG. 4, the memory operation method includes reading data of a first adjacent memory cell adjacent to a first memory cell at step S410, precharging a bit line corresponding to the first memory cell to a level which is decided depending on the data of the first adjacent memory cell at step S420, and reading the data of the first memory cell using change in the voltage of the precharged bit line at step S430.

Hereinafter, referring to FIGS. 2 to 4, the memory operation method will be described.

In FIG. 4, the first adjacent memory cell may include one or more second memory cells adjacent to the first memory cell. As described above with reference to FIG. 2, the first adjacent memory cell may correspond to the same bit line as the first memory cell or may correspond to the same word line as the first memory cell. That is, the first adjacent memory cell may be set from among memory cells arranged above or below the first memory cell or memory cells arranged in the left or right side of the first memory cell.

Hereinafter, a case in which 'C1_1' is set to the first memory cell and 'C0_1' is set to the first adjacent memory cell, that is, a case in which the first memory cell C1_1 and the first adjacent memory cell C0_1 correspond to the same bit line BL1 will be described.

When a read operation starts, the page buffer PB1 reads and stores the data of the first adjacent memory cell C0_1 (hereinafter, referred as a first adjacent data read step S410).

The page buffer PB1 precharges the bit line BL1 to a level which is decided depending on the data of the first adjacent memory cell C0_1, read in the first adjacent data read step S410 (hereinafter, referred to as a precharge step S420). At the precharge step S420, whether data of the first adjacent memory cell C0_1 is the first data or the second data is determined (A). When the data of the first adjacent memory cell is the first data, the page buffer PB1 precharges the bit line BL1 to a first level at step S421, and when the data of the first adjacent memory cell is the second data, the page buffer PB precharges the bit line BL1 to a second level at step S422. The first data may include erase data, and the second data may include program data.

When the precharge step S420 is completed, a read voltage is applied to the word line WL1 during a given period. Then, the page buffer PB1 reads the data of the first memory cell C1_1 by sensing voltage change of the bit line BL1.

The effect of the memory operation method is equal to the effect of the memory described with reference to FIG. 2.

Returning to FIG. 2, a memory in accordance with another embodiment of the present invention will be described. The memory in accordance with the embodiment of the present invention decides a precharge level of a bit line corresponding to a memory cell to be read, by considering data of two adjacent memory cells during a read operation. For this operation, one or more second memory cells adjacent to a first memory cell include a first adjacent memory cell and a second adjacent memory cell.

Hereinafter, the operation of the memory of FIG. 2 will be described, and it may be described by dividing the operation of the memory depending on the relationship between the first and second adjacent memory cells and the first memory cell.

(1) The operation of the memory when the first and second adjacent memory cells and the first memory cell correspond to the same bit line (the first and second memory cells are included in the same cell string as the first memory cell)

When the first and second adjacent memory cells correspond to the same bit line as the first memory cell and the first memory cell is a memory cell coupled to a K-th word line WLK, each of the first and second adjacent memory cells may include a memory cell coupled to one word line of zero-th to (K−1)-th and (K+1)-th to N-th word lines WL0 to WLK−1 and WLK+1 to WLN. Since cell interference increases with a reduction in distance between memory cells, the first adjacent memory cell may include a memory cell coupled to the (K−1)-th word line WLK−1, and the second adjacent memory cell may include a memory cell coupled to the (K+1)-th word line WLK+1.

In the following descriptions with reference to FIGS. 2 and 3, a case in which 'C1_1' is set to the first memory cell, 'C0_1' is set to the first adjacent memory cell, and 'C2_1' is set to the second adjacent memory cell will be shown as an example. The first memory cell C1_1, the first adjacent memory cell C0_1, and the second adjacent memory cell C2_1 correspond to the same bit line BL1 and are included in the same cell string ST1.

When a read operation starts, data of the first adjacent memory cell C0_1 is first read and stored in the page buffer PB1, and data of the second adjacent memory cell C2_1 is then read and stored in the page buffer PB1. The page buffer PB1 precharges the bit line BL1 to a level which is decided by the data of the first and second adjacent memory cells C0_1 and C2_1. When the bit line BL1 is precharged, a sensing transistor receiving a signal 'S1' is in an on state.

When both the data of the first and second adjacent memory cells C0_1 and C2_1 stored in the page buffer PB1 are first data, the page buffer PB1 precharges the bit line BL1 to a first level. Here, the first level may be equal to a level to which the bit line BL1 is precharged during a read operation in the conventional memory. When one of the data of the first and second adjacent memory cells C0_1 and C2_1 stored in the page buffer PB1 is the first data and the other is second data, the page buffer PB1 precharges the bit line BL1 to a second level lower than the first level. When both the data of the first and second adjacent memory cells C0_1 and C2_1 stored in the page buffer PB1 are the second data, the page buffer PB1 precharges the bit line BL1 to a third level lower than the second level. The first data may include erase data, and the second data may include program data.

That is, the page buffer PB1 of the memory in accordance with the embodiment of the present invention precharges the bit line BL1 to a lower level, as the number of program data among the data of the memory cells adjacent to the first memory cell C1_1 increases. That is because the cell interference increases in accordance with the increase in the number of memory cells storing program data, among the adjacent memory cells.

Then, a read voltage is applied to the word line WL1 coupled to the first memory cell C1_1 during a given period. After the read voltage is applied to the word line WL1, the voltage level of the bit line BL1 is decided depending on the data stored in the first memory cell C1_1. The page buffer PB1 senses the voltage of the bit line BL1 and reads data of the first memory cell C1_1 depending on the sensed voltage level of the bit line BL1. The configuration and operation of the page buffer PB1 will be described in detail with reference to FIG. 5.

No matter which word lines the first and second adjacent memory cells are coupled to, among the zero-th to (K−1)-th and (K+1)-th to N-th word lines WL0 to WLK−1 and WLK+1 to WLN, the operation of the memory is performed in the same manner as described above. In the above-described configuration, the data of the first memory cell C1_1 and the data of first memory cells C1_0 and C1_2 to C1_M included in the same page as the memory cell C1_1 are read together. At this time, the first adjacent memory cells corresponding to the first memory cells C1_0 and C1_2 to C1_M are set to C0_0 and C0_2 to C0_M, respectively, and the second adjacent memory cells are set to C2_0 and C2_2 to C2_M, respectively. Furthermore, the operations of page buffers PB0 and PB2 to PBM corresponding to the first memory cells C1_0 and C1_2 to C1_M, respectively, are performed in the same manner as the above-described page buffer PB1.

(2) The operation of the memory when the first adjacent memory cell and the first memory cell correspond to the same word line (the first and second adjacent memory cells and the first memory cell are coupled to the same word line)

When the first and second adjacent memory cells correspond to the same word line as the first memory cell and the first memory cell is a memory cell included in the K-th cell string STK, each of the first and second adjacent memory cells may include a memory cell included in one cell string of the zero-th to (K−1)-th and the (K+1)-th to M-th cell strings ST0 to STK−1 and STK+1 to STM.

The reason why the cell interference is compensated by lowering the precharge level of the bit line when program data is stored in the adjacent memory cell is the same as described above with reference to FIG. 2. When the number of adjacent memory cells is two, the level of the cell interference may differ between a case where one of the data of the adjacent memory cells is erase data and the other is program data and a case where both the data of the adjacent memory cells are program data (the level of the cell interference is higher in the latter case). Therefore, the precharge level of the bit line is decided by considering the difference. That is, in the latter case, the bit line is precharged to a lower level than in the former case. In the above-described configuration, the precharge level of the bit line is decided by considering the data of two adjacent memory cells. Depending on different designs, however, the precharge level of the bit line may be decided by considering data of three or more adjacent memory cells.

Figure 5:
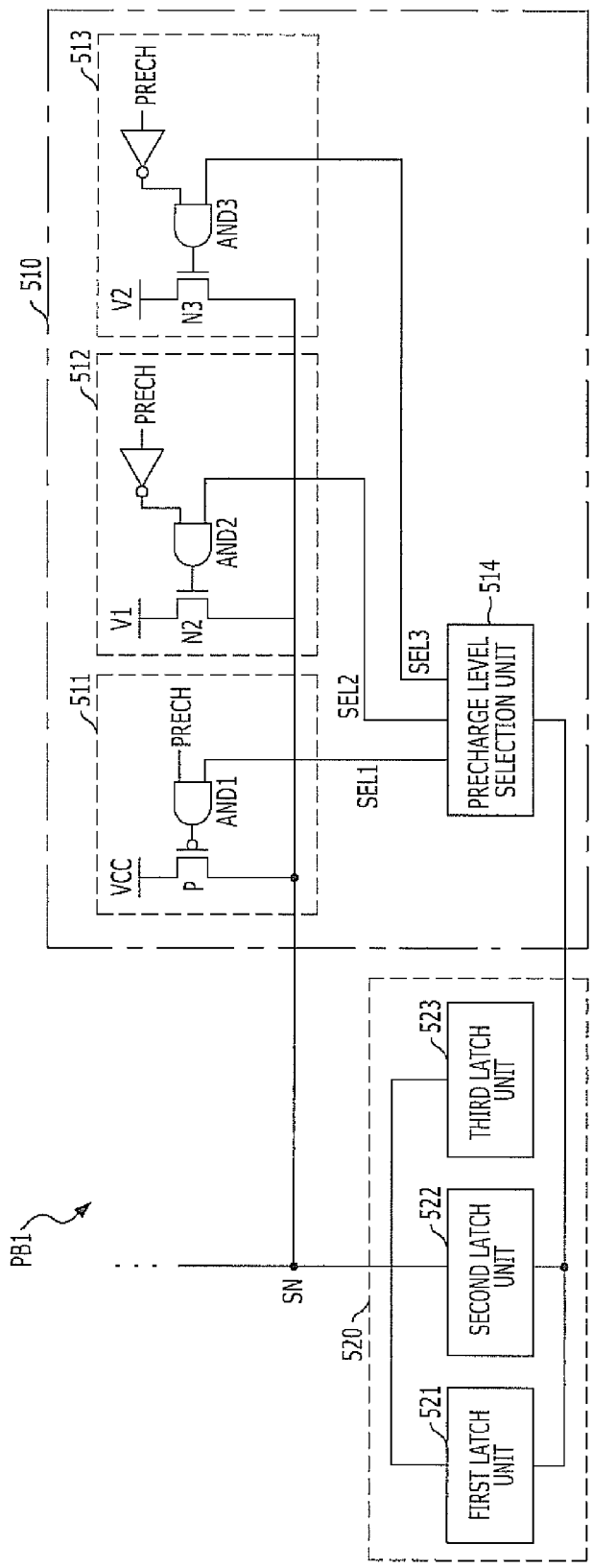
FIG. 5 is a configuration diagram of a page buffer PB1 in accordance with another exemplary embodiment of the present invention.

FIG. 5 is a configuration diagram of the page buffer PB1 in accordance with the embodiment of the present invention. In the following descriptions, a case in which the first memory cell is set to C1_1, the first adjacent memory cell is set to C0_1, and the second adjacent memory cell is set to C2_1 will be shown as an example.

Hereinafter, the configuration and operation of the page buffer PB1 will be described. The configurations and operations of the other page buffers PB0 and PB2 to PBM of FIG. 2 are the same as the configuration and operation as the page buffer PB1 of FIG. 5.

Referring to FIG. 5, the page buffer PB1 includes a precharge unit 510 and a latch unit 520. The precharge unit 510 is configured to precharge a bit line BL1 to one level of first to third levels depending on data of the first and second adjacent memory cells C0_1 and C2_1. The latch unit 520 is configured to store data of a first memory cell C1_1 and the data of the first and second adjacent memory cells C0_1 and C2_1 and transmit the data of the first and second adjacent memory cells C0_1 and C2_1 to the precharge unit 510.

For this operation, the precharge unit 510 includes a first precharge unit 511, a second precharge unit 512, a third precharge unit 513, and a precharge level selection unit 514. The first precharge unit 511 is configured to precharge the bit line BL1 to the first level. The second precharge unit 512 is configured to precharge the bit line BL1 to the second level. The third precharge unit 512 is configured to precharge the bit line BL1 to the third level. The precharge level selection unit 514 is configured to enable the first precharge unit 511 when both the data of the first and second adjacent memory cells C0_1 and C2_1 are first data, enable the second precharge unit 512 when one of the data of the first and second adjacent memory cells C0_1 and C2_1 is the first data and the other is second data, and enable the third precharge unit 513 when both the data of the first and second adjacent memory cells C0_1 and C2_1 are the second data.

The latch unit 520 includes a first latch unit 521, a second latch unit 522, and a third latch unit 523. The first latch unit 521 is configured to sequentially store the data of the first adjacent memory cell C0_1, the data of the second adjacent memory cell C2_1, and the data of the first memory cell C1_1. The second latch unit 522 is configured to first receive the data of the second adjacent memory cell C2_1 from the first latch unit 521, store the received data, and transmit the stored data to the precharge level selection unit 514, and then receive the data of the first adjacent memory cell C0_1 from the third latch unit 523, store the received data, and transmit the stored data to the precharge level selection unit 514. The third latch unit 523 is configured to receive the data of the first adjacent memory cell C0_1 from the first latch unit 521 and store the received data. The first to third latch units 521, 522, and 523 may correspond to the main latch, the cache latch, and the temporary latch units, respectively, which have been described with reference to FIG. 3. Furthermore, although not illustrated in FIG. 5, the page buffer PB1 may further include the flag latch unit described above with reference to FIG. 3.

Referring to FIG. 5, the operation of the page buffer PB1 will be described in more detail.

During a read operation, the data of the first adjacent memory cell C0_1 is first read and stored in the first latch unit 521. The data of the first adjacent memory cell C0_1 stored in the first latch unit 521 is transmitted to the third latch unit 523, and the third latch unit 523 receives and stores the data of the first adjacent memory cell C0_1. Then, the data of the second adjacent memory cell C2_1 is read and stored in the first latch unit 521. The data of the second adjacent memory cell C2_1 stored in the first latch unit 521 is transmitted to the second latch unit 522. The second latch unit 522 receives and stores the data of the second adjacent memory cell C2_1 and transmits the stored data to the precharge level selection unit 514. The data of the first adjacent memory cell C0_1 stored in the third latch unit 523 is transmitted to the second latch unit 522. The second latch unit 522 receives and stores the data of the first adjacent memory cell C0_1 and transmits the stored data to the precharge level selection unit 514.

The precharge level selection unit 514 activates a first selection signal SEL1 to a low level in a period for precharging the bit line BL1 (hereinafter, referred to as a precharge period), when both the data of the first and second adjacent memory cells C0_1 and C2_1 are the first data (erase data). Furthermore, the precharge level selection unit 514 activates a second selection signal SEL2 to a high level, when one of the data of the first and second adjacent memory cells C0_1 and C2_1 is the first data and the other is the second data (program data), and activates a third selection signal SEL3 to a high level when both the data of the first and second adjacent memory cells C0_1 and C2_1 are the second data.

When the first selection signal SEL1 is activated in the precharge period, an output of an AND gate AND1 becomes low in an activation period of a precharge signal PRECH which is activated to a low level during the precharge period. Therefore, a PMOS transistor P is turned on to transmit a first-level voltage VCC to the bit line BL1 through a sensing node SN. Therefore, the bit line BL1 is precharged to the first level. At this time, since outputs of the other AND gates AND2 and AND3 are low, NMOS transistors N1 and N12 are turned off.

When the second selection signal SEL2 is activated in the precharge period, an output of an AND gate AND2 becomes high in the activation period of the precharge signal PRECH. Therefore, the NMOS transistor N1 is turned on to transmit a second-level voltage V1 to the bit line BL1 through the sensing node SN. Therefore, the bit line BL1 is precharged to the second level. At this time, since the output of the AND gate AND1 is high and the output of the AND gate AND3 is low, the PMOS transistor P and the NMOS transistor N2 are turned off.

When the third selection signal SEL3 is activated in the precharge period, an output of an AND gate AND3 becomes high in a period in which the precharge signal PRECH is activated. Therefore, the NMOS transistor N2 is turned on to transmit a third-level voltage V2 to the bit line BL1 through the sensing node SN. Therefore, the bit line BL1 is precharged to the third level. At this time, since the output of the AND gate AND1 is high and the output of the AND gate AND2 is low, the PMOS transistor P and the NMOS transistor N1 are turned off.

When a read voltage is applied to the first memory cell C1_1 after the bit line BL1 is precharged to one level of the first to third levels, the voltage of the bit line BL1 is lowered to a different level depending on the data stored in the first memory cell C1_1. The page buffer PB1 senses the changed voltage of the bit line BL through the sensing node SN and stores the read data of the first memory cell C1_1 in the first latch unit 521 using the sensed voltage.

Figure 6:
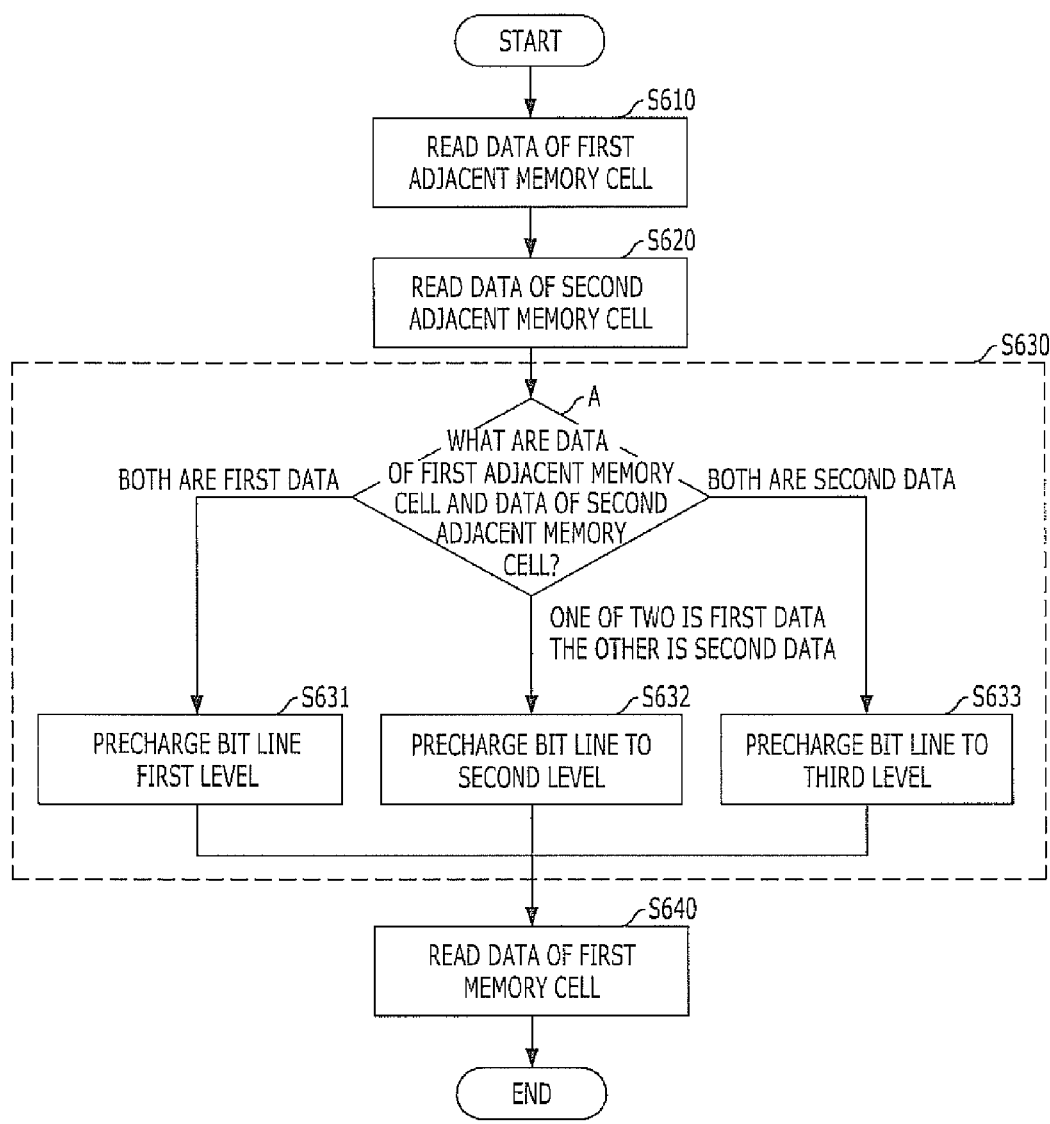
FIG. 6 is a flow chart explaining a method for operating a memory in accordance with the exemplary embodiment of the present invention.

FIG. 6 is a flow charge illustrating a method for operating the memory in accordance with the embodiment of the present invention. In the memory operation method of FIG. 6, a precharge level of a bit line corresponding to a memory cell to be read is decided by considering data of two adjacent memory cells during a read operation. Referring to FIG. 6, a case in which one or more second memory cells adjacent to a first memory cell to be read include first and second adjacent memory cells will be described.

Referring to FIG. 6, the memory operation method includes reading data of the first adjacent memory cell adjacent to the first memory cell at step S610, reading data of the second adjacent memory cell adjacent to the first memory cell at step S620, precharging a bit line corresponding to the first memory cell to a level which is decided depending on the data of the first and second adjacent memory cells at step S630, and reading data of the first memory cell using change in the voltage of the precharged bit line at step S640.

Hereinafter, the memory operation method will be described with reference to FIGS. 2, 5, and 6.

As described above, the first and second adjacent memory cells may correspond to the same bit line as the first memory cell or the same word line as the first memory cell.

In the following descriptions, a case in which the first memory cell is set to C1_1, the first adjacent memory cell is set to C0_1, and the second adjacent memory cell is set to C2_1 will be shown as an example. In this case, the first memory cell C1_1 and the first and second adjacent memory cells C0_1 and C2_1 correspond to the same bit line BL1.

When a read operation starts, the page buffer PB1 first reads and stores the data of the first adjacent memory cell C0_1 (hereinafter, referred to as first adjacent data read step S610).

Then, the page buffer PB1 reads and stores the data of the second adjacent memory cell C2_1 (hereinafter, referred to as second adjacent data read step S620).

The page buffer PB1 precharges the bit line BL1 to a level which is decided depending on the data of the first adjacent memory cell C0_1 read at the first adjacent data read step S610 and the data of the second adjacent memory cell C2_1 read at the second adjacent data read step S620 (hereinafter, referred to as precharge step S630). At the precharge step S630, whether the data of the first and second adjacent memory cells C0_1 and C2_1 are the first data or the second data is determined (A). When both the data of the first and second adjacent memory cells C0_1 and C2_1 are first data, the page buffer PB1 precharges the bit line BL1 to the first level at step S631. When one of the data of the first and second adjacent memory cells C0_1 and C2_1 is the first data and the other is the second data, the page buffer PB1 precharges the bit line BL to the second level at step S632. When both the data of the first and second adjacent memory cells C0_1 and C2_1 are the second data, the page buffer PB1 precharges the bit line BL1 to the third level.

When the precharge step S630 is completed, a read voltage is applied to the word line WL1 during a given period. Then, the page buffer PB1 reads the data of the first memory cell C1_1 by sensing change in the voltage of the bit line BL1.

The effect of the memory operation method is the same as the effect of the memory described with reference to FIG. 2.

Figure 7:
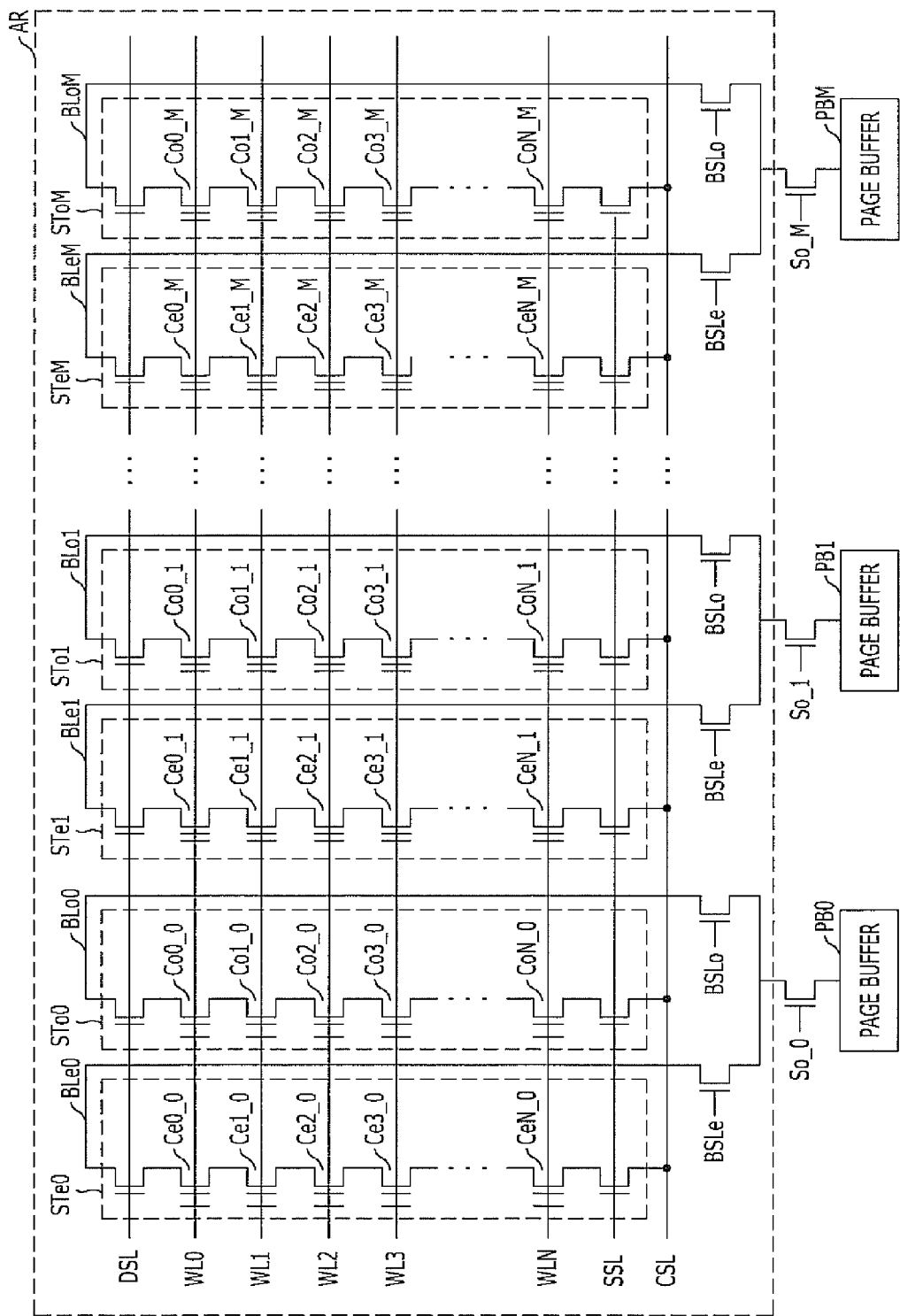
FIG. 7 is a configuration diagram of a memory in accordance with another exemplary embodiment of the present invention.

FIG. 7 is a configuration diagram of a memory in accordance with another embodiment of the present invention. In the memory illustrated in FIG. 7, a page buffer corresponds to two bit lines (even bit line and odd bit line), and a precharge level of a bit line corresponding to a memory cell to be read is decided by considering data of one adjacent memory cell during a read operation.

A cell array AR of the memory illustrated in FIG. 7 includes a plurality of even cell strings STe0 to STeM and a plurality of odd cell strings STo0 to SToM (it is described as an example that the cell array includes (M+1) even cell strings and (M+1) odd cell strings). The descriptions of the cell string are the same as described above with reference to FIG. 2.

Even bit lines BLe0 to BLeM coupled to the even cell strings STe0 to STeM, respectively, are coupled to page buffers PB0 to PBM through even selection transistors receiving an even signal BSLe, and odd bit liens BLo0 to BLoM coupled to the odd cell strings STo0 to SToM, respectively, are coupled to the page buffer PB0 to PBM through odd selection transistors receiving an odd signal BSLo. In 'CeX_Y' ('CoX_Y'), 'X' indicates which word line an even memory cell (odd memory cell) correspond (is coupled) to, and 'Y' indicates which even cell string (odd cell string) an even memory cell (odd memory cell) is included in. For example, 'Ce2_5' ('Co2_5') represents an even memory cell (odd memory cell) corresponding to a second word line WL2 and included in a fifth even cell string STe5 (fifth odd cell string STo5) (start from zero-th).

When access to an even memory cell included in the even cell strings STe0 to STeM is performed, the even signal BSLe is activated to turn on an even selection transistor. When access to an odd memory cell included in the odd cell strings STo0 to SToM is performed, the odd signal BSLo is activated to turn on an odd selection transistor.

Referring to FIG. 7, the memory includes a first even memory cell, a first odd memory cell, an even bit line corresponding to the first even memory cell, an odd bit line corresponding to the first odd memory cell, one or more second memory cells adjacent to the first even memory cell, one or more third memory cells adjacent to the first odd memory cell, and a page buffer corresponding to the bit lines. The page buffer is configured to precharge the even bit line to a level which is decided depending on the data of the one or more second memory cell, when data of the first even memory cell is read, and precharge the odd bit line to a level which is decided depending on data of one or more third memory cells, when data of the first odd memory cell is read.

Here, the first even memory cell indicates an even memory cell from which data is to be read, and the one or more second memory cells indicate memory cells adjacent to the first even memory cell. Furthermore, the first odd memory cell indicates an odd memory cell from which data is to be read, and the one or more third memory cells indicate memory cells adjacent to the first odd memory cell. The descriptions of the adjacent memory cells are the same as described with reference to FIG. 2. In FIG. 7, a case in which the one or more second memory cells include a first even adjacent memory cell and the one or more third memory cells include a first odd adjacent memory cell, that is, a case in which one memory cell is adjacent to the first even memory cell and the first odd memory cell, respectively, will be described as an example.

Hereinafter, the operation of the memory of FIG. 7 will be described, and it may be described by dividing the operation of the memory depending on the relationships between the first even adjacent memory cell and the first even memory cell and between the first odd adjacent memory cell and the first odd memory cell. Since a read operation of the even memory cell and a read operation of the odd memory cell are performed substantially in the same manner, the following descriptions will be based on the read operation of the first even memory cell.

(1) The operation of the memory when the first even adjacent memory cell and the first even memory cell correspond to the same even bit line (when the first even adjacent memory cell and the first even memory cell are included in the same cell string)

When the first even adjacent memory cell corresponds to the same even bit line as the first even memory cell and the first even memory cell is a memory cell coupled to a K-th word line WLK (K is a natural number equal to or less than N), the first even adjacent memory cell may include a memory cell coupled to one word line of zero-th to (K−1)-th word lines WL0 to WLK−1 or a memory cell coupled to one word line of (K+1)-th to Nth word lines WLK+1 to WLN. Since cell interference increases with a reduction in distance between memory cells, the first even adjacent memory cell may include a memory cell coupled to the (K−1)-th word line WLK−1 or a memory cell coupled to the (K+1)-th word line WLK+1.

Hereinafter, a case in which Ce1_1 is set to the first even memory cell and Co1_1 is set to the first even adjacent memory cell will be described. The first even memory cell Ce1_1 and the first even adjacent memory cell Ce0_1 correspond to the same even bit line BLe1 and are included in the same even cell string STe1. During a read operation for the first even memory cell Ce1_1, the even signal BSLe is activated to turn on the even selection transistor, and the odd signal BSLo is deactivated to turn off the odd selection transistor.

When the read operation for the first even memory cell Ce1_1 starts, data of the first even adjacent memory cell Ce0_1 is first read and stored in the page buffer PB1. The page buffer PB1 precharges the even bit line BLe1 to a level which is decided by the data of the first even adjacent memory cell Ce0_1. When the even bit line BLe1 is precharged, a sensing transistor receiving a signal 'So_1' is in an on state.

When the data of the first even adjacent memory cell Ce0_1 stored in the page buffer PB1 is first data, the page buffer PB1 precharges the even bit line BLe1 to a first level. When the data of the first even adjacent memory cell Ce0_1 stored in the page buffer PB1 is second data, the page buffer PB1 precharges the even bit line BLe1 to a second level lower than the first level. At this time, the first data may include erase data, and the second data may include program data. The descriptions of the first and second levels are the same as described with reference to FIG. 2.

A process of reading the data of the first even memory cell Ce1_1 using the voltage of the precharged even bit line BLe1 is performed in the same manner as described with reference to FIG. 2. In the above-described configuration, the data of the first even memory cell Ce1_1 and data of first even memory cells Ce1_0 and Ce1_2 to Ce1_M included in the same page as the first even memory cell Ce1_1 are read together. At this time, first even adjacent memory cells corresponding to the first even memory cells Ce1_0 and Ce1_2 to Ce1_M are represented by Ce0_0 and Ce0_2 to Ce0_M, respectively, and the operations of page buffers PB0 and PB2 to PBM corresponding to the first even memory cells Ce1_0 and Ce1_2 to Ce1_M, respectively, are performed in the same manner as the operation of the above-described page buffer PB1.

An operation of reading the data of the first odd memory cell is performed in a similar manner to the operation of reading the data of the first even memory cell, except that an odd signal is activated to turn on an odd selection transistor and an even signal is deactivated to turn off an even selection transistor (therefore, the page buffer precharges the odd bit line to a level which is decided depending on the data of the first odd adjacent memory cell).

(2) The operation of the memory when the first even adjacent memory cell and the first even memory cell correspond to the same word line (when the first even adjacent memory cell and the first even memory cell are coupled to the same word line)

When the first even adjacent memory cell corresponds to the same word line as the first even memory cell and the first even memory cell is a memory cell included in the K-th even cell string STeK, the first even adjacent memory cell may include a memory cell included in one cell string of the zero-th to (K−1)-th even cell strings STe0 to STeK−1 or a memory cell included in one cell string of the (K+1)-th to M-th even cell strings STeK+1 to STeM.

Furthermore, the first even adjacent memory cell may include a memory cell included in one cell string of the zero-th to M-th odd cell strings STo0 to SToM. That is, the first even adjacent memory cell may correspond to an odd bit line adjacent to the even bit line corresponding to the first even memory cell.

Since cell interference increases with a reduction in distance between memory cells, the first even adjacent memory cell may include a memory cell included in the (K−1)-th even cell string STeK−1 or a memory cell included in the (K+1)-th even cell string STeK+1. Alternatively, the first even adjacent memory cell may include a memory cell included in the (K−1)-th odd cell string SToK−1 or a memory cell included in the K-th odd cell string SToK.

When the first even adjacent memory cell is a memory cell included in the K-th odd cell string SToK, the first even memory cell and the first even adjacent memory cell correspond to the same page buffer PBK. Therefore, as the read operation of the even memory cell is performed after the read operation of the odd memory cell, the level of the even bit line may be decided depending on the data of the odd memory cell.

The operation of reading the data of the first odd memory cell is performed in a similar manner to the operation of reading the data of the above-described first even memory cell, except that the odd signal BLSo is activated to turn on the odd selection transistor and the even signal BLSe is deactivated to turn off the even selection transistor (therefore, the page buffer precharges the odd bit line to a level which is decided depending on the data of the first ode adjacent memory cell).

Here, when the first odd memory cell is included in the K-th odd cell string SToK, the first odd adjacent memory cell may include a memory cell included in one odd cell string of the zero-th to (K−1)-th odd cell strings SToO to SToK−1 or a memory cell included in one odd cell string of the (K+1)-th to M-th odd cell strings SToK+1 to SToM. Furthermore, the first odd adjacent memory cell may include a memory cell included in one cell string of the zero-th to M-th even cell strings STe0 to STeM. That is, the first odd adjacent memory cell may correspond to an even bit line adjacent to the odd bit line corresponding to the first odd memory cell.

Since cell interference increases with a reduction in distance between memory cells, the first odd adjacent memory cell may include a memory cell included in the (K−1)-th odd cell string SToK−1 or a memory cell included in the (K+1)-th odd cell string SToK+1. Alternatively, the first odd adjacent memory cell may include a memory cell included in the K-th even cell string STeK or a memory cell included in the (K+1)-th even cell string STeK+1.

When the first odd adjacent memory cell is a memory cell included in the K-th even cell string STeK, the first odd memory cell and the first odd adjacent memory cell correspond to the same page buffer PBK. Therefore, as the read operation of the odd memory cell is performed after the read operation of the even memory cell, the level of the odd bit line may be decided depending on the data of the even memory cell.

For reference, in order to precharge a bit line to an accurate level during a read operation, the corresponding bit line may be discharged before the bit line is precharged. Since the discharge of the bit line may be easily understood by those skilled in the art to which the present invention pertains and has no direct relation with the present invention, the detailed descriptions of the discharge of the bit line are omitted here.

So far, the case in which an adjacent memory cell corresponds to the same bit line or the same word line as a memory cell to be read has been described. However, the range of the adjacent memory cell is not limited thereto. A memory cell, which has an effect upon the threshold voltage of the memory cell to be read with data stored therein, may be set to an adjacent memory cell, even though the memory cell does not correspond to the same bit line or the same word line as the memory cell to be read.

In accordance with the embodiments of the present invention, when data of a memory cell is read in case where an adjacent memory cell is programmed, the level of a voltage to which a bit line is precharged may be controlled to reduce an error of the read operation.

While the present invention has been described with respect to the specific embodiments, it will be apparent to those skilled in the art that various changes and modifications may be made without departing from the spirit and scope of the invention as defined in the following claims.

What is claimed is:

1. A memory comprising:
   a first memory cell;
   a bit line corresponding to the first memory cell;
   at least one second memory cell adjacent to the first memory cell; and
   a page buffer configured to read data of the first memory cell by precharging the bit line to voltage level which is decided in response to data of the at least one second memory cell,
   wherein the page buffer precharges the bit line to a first voltage level when the data of the at least one second memory cell is erase data, and the page buffer precharges the bit line to a second voltage level lower than the first voltage level when the data of the at least one second memory cell is program data.

2. The memory of claim 1, wherein the at least one second memory cell corresponds to the bit line of the first memory cell.

3. The memory of claim 2, wherein the at least one second memory cell is arranged above or below the first memory cell.

4. The memory of claim 1, wherein the at least one second memory cell corresponds to the same word line as the first memory cell.

5. The memory of claim 4, wherein the at least one second memory cell is arranged in the left or right side of the first memory cell.

6. The memory of claim 1, wherein the page buffer comprises:
   a precharge unit configured to precharge the bit line to a first or second voltage level depending on the data of the at least one second memory cell; and
   a latch unit configured to store the data of the first memory cell and the data of the at least one second memory cell and transmit the data of the at least one second memory cell to the precharge unit.

7. The memory of claim 6, wherein the precharge unit comprises:
   a first precharge unit configured to precharge the bit line to the first voltage level;
   a second precharge unit configured to precharge the bit line to the second voltage level lower than the first voltage level; and
   a precharge level selection unit configured to enable the first precharge unit when the data of the as least one second memory cell is erase data and enable the second precharge unit when the data of the as least one second memory cell is program data.

8. A memory comprising:
   a first memory cell;
   a bit line corresponding to the first memory cell;
   at least one second memory cell adjacent to the first memory cell, wherein the as least one second memory cell comprise a first adjacent memory cell and a second adjacent memory cell; and
   a page buffer configured to read data of the first memory cell by precharging the bit line to voltage level which is decided in response to data of the at least one second memory cell,
   wherein the page buffer precharges the bit line to a first voltage level when both data of the first and second adjacent memory cells are erase data, precharges the bit line to a second voltage level lower than the first voltage level when one of the data of the first and second adjacent memory cells is the erase data and the other is program data, and precharges the bit line to a third voltage level lower than the second voltage level when both the data of the first and second adjacent memory cells are the program data.

9. The memory of claim 8, wherein the page buffer comprises:
   a precharge unit configured to precharge the bit line to one of the first to third voltage levels depending on the data of the first and second adjacent memory cells; and
   a latch unit configured to store the data of the first memory cell and the first and second adjacent memory cells and transmit the data of the first and second adjacent memory cells to the precharge unit.

10. The memory of claim 9, wherein the precharge unit comprises:
    a first precharge unit configured to precharge the bit line to the first voltage level;
    a second precharge unit configured to precharge the bit line to the second voltage level;
    a third precharge unit configured to precharge the bit line to the third voltage level; and
    a precharge level selection unit configured to enable the first precharge unit when both the data of the first and second adjacent memory cells are the erase data, enable the second precharge unit when one of the data of the first and second adjacent memory cells is the erase data and the other is the program data, and enable the third precharge unit when both the data of the first and second adjacent memory cells are the program data.

11. A method for operating a memory, comprising:
    reading data of at least one second memory cell adjacent to a first memory cell;
    precharging a bit line corresponding to the first memory cell to a voltage level which is decided in response to data of the at least one second memory cell; and
    reading data of the first memory cell using voltage change of the precharged bit line
    wherein the precharging of the bit line comprises:
    precharging the bit line to a first voltage level when the data of the at least one second memory cell is erase data; and
    precharging the bit line to a second voltage level lower than the first voltage level when the data of the at least one second memory cell is program data.

12. The method of claim 11, wherein the at least one second memory cell corresponds to the bit line of the first memory cell and is arranged above or below the first memory cell.

13. The method of claim 11, wherein the at least one second memory cell corresponds to the same word line as the first memory cell and is arranged in the left or right side of the first memory cell.

14. A method for operating a memory, comprising:
reading data of at least one second memory cell adjacent to a first memory cell, wherein the at least one second memory cell comprise a first adjacent memory cell and a second adjacent memory cell;
precharging a bit line corresponding to the first memory cell to a voltage level which is decided in response to data of the at least one second memory cell; and
reading data of the first memory cell using voltage change of the precharged bit line
wherein the precharging of the bit line comprises:
precharging the bit line to a first voltage level when both data of the first and second adjacent memory cells are erase data;
precharging the bit line to a second voltage level lower than the first voltage level when one of the data of the first and second adjacent memory cells is the erase data and the other is program data; and
precharging the bit line to a third voltage level lower than the second voltage level when both the data of the first and second adjacent memory cells are the program data.

15. A memory comprising:
a first even memory cell;
a first odd memory cell;
an even bit line corresponding to the first even memory cell;
an odd bit line corresponding to the first odd memory cell;
at least one second memory cell adjacent to the first even memory cell;
at least one third memory cell adjacent to the first odd memory cell; and
a page buffer configured to precharge the bit line to a voltage level which is decided in response to data of the at least one second memory cell when reading data of the first even memory cell, and precharge the bit line to a voltage level which is decided in response to data of the at least one third memory cell when reading data of the first odd memory cell.

16. The memory of claim 15, wherein the page buffer precharges the even bit line to a first voltage level when data of the at least one second memory cell is erase data, precharges the even bit line to a second voltage level lower than the first voltage level when the data of the at least one second memory cell is program data, precharges the odd bit line to the first voltage level when data of the at least one third memory cell is the erase data, and precharges the odd bit line to the second voltage level when the data of the at least one third memory cell is the program data.

17. The memory of claim 16, wherein the at least one second memory cell corresponds to the bit line of the first even memory cell, and the at least one third memory cell corresponds to the bit line of the first odd memory cell.

18. The memory of claim 16, wherein the at least one second memory cell corresponds to the same word line as the first even memory cell, and the at least one third memory cell corresponds to the same word line as the first odd memory cell.

19. The memory of claim 18, wherein the at least one second memory cell corresponds to an odd bit line adjacent to the even bit line, and the at least one third memory cell corresponds to an even bit line corresponding to the first odd bit line.

* * * * *